(12) United States Patent
Visser et al.

(10) Patent No.: US 9,240,919 B2
(45) Date of Patent: Jan. 19, 2016

(54) POLAR MODULATOR

(71) Applicant: ST-Ericsson SA, Plan-les-Ouates (CH)

(72) Inventors: Hendrik Visser, Wijchen (NL); Roeland Heijna, Well (NL)

(73) Assignee: ST-ERICSSON SA, Plan-les-Ouates (CH)

( * ) Notice: Subject to any disclaimer, the term of this patent is extended or adjusted under 35 U.S.C. 154(b) by 0 days.

(21) Appl. No.: 14/401,183

(22) PCT Filed: Jun. 18, 2013

(86) PCT No.: PCT/EP2013/062669
§ 371 (c)(1),
(2) Date: Nov. 14, 2014

(87) PCT Pub. No.: WO2013/189954
PCT Pub. Date: Dec. 27, 2013

(65) Prior Publication Data
US 2015/0139360 A1    May 21, 2015

Related U.S. Application Data

(60) Provisional application No. 61/665,607, filed on Jun. 28, 2012.

(30) Foreign Application Priority Data

Jun. 20, 2012 (EP) .................................... 12172836

(51) Int. Cl.
*H04L 27/36* (2006.01)
*H03C 5/00* (2006.01)
(Continued)

(52) U.S. Cl.
CPC ....... *H04L 27/36* (2013.01); *H03C 5/00* (2013.01); *H04B 14/008* (2013.01); *H04L 27/361* (2013.01); *H04W 52/0209* (2013.01)

(58) Field of Classification Search
CPC ........... H04L 27/34; H04L 1/00; H04L 27/36; H04B 14/008; H04W 52/0209
USPC ................................................ 375/295, 298
See application file for complete search history.

(56) References Cited

U.S. PATENT DOCUMENTS

2006/0045205 A1  3/2006  Jensen
2006/0209620 A1* 9/2006  Deivasigamani et al. .... 365/233
(Continued)

FOREIGN PATENT DOCUMENTS

EP    2 034 686 A2    3/2009
WO    2004/034606 A2   4/2004

OTHER PUBLICATIONS

International Search Report issued in corresponding International application No. PCT/EP2013/062669, date of mailing Jul. 5, 2013.
(Continued)

*Primary Examiner* — Kevin M Burd
(74) *Attorney, Agent, or Firm* — Patent Portfolio Builders PLLC

(57) ABSTRACT

A polar modulator (200) comprises a modulation generator (10) arranged to generate phase modulation data and amplitude modulation data; and a phase modulation stage (20) arranged to generate a phase modulated, PM, carrier signal and a PM clock signal, wherein the PM carrier signal has a PM carrier signal frequency and the PM clock signal has a PM clock signal frequency, and the PM carrier signal frequency is higher than the PM clock signal frequency, the PM carrier signal and the PM clock signal are phase modulated by the phase modulation data, and the phase modulation stage (20) comprises an adjustable delay stage (50) arranged to adjust a relative delay between the PM carrier signal and the PM clock signal to a target value. The polar modulator (200) further comprises a re-timing circuit (40) arranged to generate an amplitude modulation, AM, clock signal by re-timing the PM clock signal with the PM carrier signal; an amplitude modulation stage (30) arranged to employ the AM clock signal to clock the amplitude modulation data into the amplitude modulation stage (30) and arranged to amplitude modulate the PM carrier signal with the amplitude modulation data; an error detection stage (60) arranged to generate an indication of a magnitude of a first deviation of the AM clock signal from a target condition; and a control stage (70) arranged to select the target value of the relative delay by determining, by controlling the adjustment of the relative delay by the adjustable delay stage (50), a first value of the relative delay that maximizes the magnitude of the first deviation, and applying an offset to the first value of the relative delay.

18 Claims, 12 Drawing Sheets

(51) Int. Cl.
*H04B 14/00* (2006.01)
*H04W 52/02* (2009.01)

(56) References Cited

U.S. PATENT DOCUMENTS

| | | | |
|---|---|---|---|
| 2006/0291589 A1* | 12/2006 | Eliezer et al. | 375/302 |
| 2007/0110194 A1 | 5/2007 | De Obaldia et al. | |
| 2008/0007574 A1* | 1/2008 | Yoshida et al. | 345/690 |
| 2010/0081397 A1 | 4/2010 | Lee et al. | |
| 2010/0124889 A1* | 5/2010 | Osman et al. | 455/108 |
| 2011/0182382 A1 | 7/2011 | Staszewski et al. | |
| 2012/0057655 A1* | 3/2012 | Marsili et al. | 375/300 |
| 2012/0068177 A1* | 3/2012 | Tain et al. | 257/48 |

OTHER PUBLICATIONS

Written Opinion of the International Searching Authority issued in corresponding International application No. PCT/EP2013/062669, date of mailing Jul. 5, 2013.

Extended European Search Report issued in corresponding European application No. EP 12 17 2836, date of completion of the search Nov. 22, 2012.

Waheed, Khurram, et al., "Curse of Digital Polar Transmission: Precise Delay Alignment in Amplitude and Phase Modulation Paths," IEEE International Symposium on Circuits and Systems (ISCAS) 2008, Piscataway, NJ, USA, May 18, 2008, pp. 3142-3145, XP031392679; ISBN: 978-1-4244-1683-7.

* cited by examiner

| Bit Number | 0 | 1 | 2 | 3 | 4 | 5 | 6 | 7 | 8 | 9 | Decimal Value of Digital Sequence | Duty Cycle of Digital Sequence | Delay Increment |
|---|---|---|---|---|---|---|---|---|---|---|---|---|---|
| Decimal Value of Bit | 1 | 2 | 4 | 8 | 16 | 32 | 64 | 128 | 256 | 512 | | | |
| Digital Sequences | 1 | 1 | 0 | 0 | 0 | 1 | 1 | 0 | 0 | 0 | 99 | 40% | 0 |
| | 1 | 1 | 1 | 0 | 0 | 1 | 1 | 1 | 0 | 0 | 231 | 60% | 0.1 |
| | 0 | 1 | 1 | 0 | 0 | 0 | 1 | 1 | 0 | 0 | 198 | 40% | 0.2 |
| | 0 | 1 | 1 | 1 | 0 | 0 | 1 | 1 | 1 | 0 | 462 | 60% | 0.3 |
| | 0 | 0 | 1 | 1 | 1 | 0 | 0 | 1 | 1 | 0 | 396 | 40% | 0.4 |
| | 0 | 0 | 1 | 1 | 1 | 0 | 0 | 1 | 1 | 1 | 924 | 60% | 0.5 |
| | 0 | 0 | 0 | 1 | 1 | 1 | 0 | 0 | 1 | 1 | 792 | 40% | 0.6 |
| | 1 | 0 | 0 | 0 | 1 | 1 | 1 | 0 | 0 | 1 | 825 | 60% | 0.7 |
| | 1 | 0 | 0 | 0 | 1 | 1 | 0 | 0 | 0 | 1 | 561 | 40% | 0.8 |
| | 1 | 1 | 0 | 0 | 1 | 1 | 1 | 0 | 0 | 1 | 627 | 60% | 0.9 |

FIG. 4

| Voltage Setting | Digital Sequence (decimal value) | | | | | | | | | |
|---|---|---|---|---|---|---|---|---|---|---|
| | 99 | 231 | 198 | 462 | 396 | 924 | 792 | 825 | 561 | 627 |
| a) | | | X | X | | | | | | |
| b) | | | X | X | X | | | | | |
| c) | | X | X | X | | | | | X | |
| d) | X | X | X | | | | | | | |
| e) | | X | X | | | | | | | |
| f) | | X | X | | | | | | | |
FIG. 6
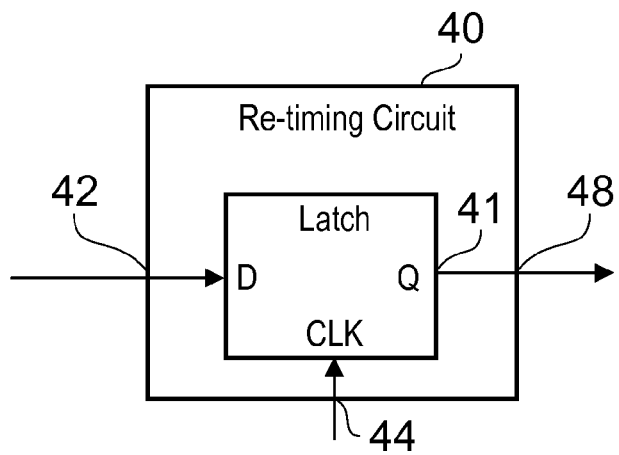
FIG. 7
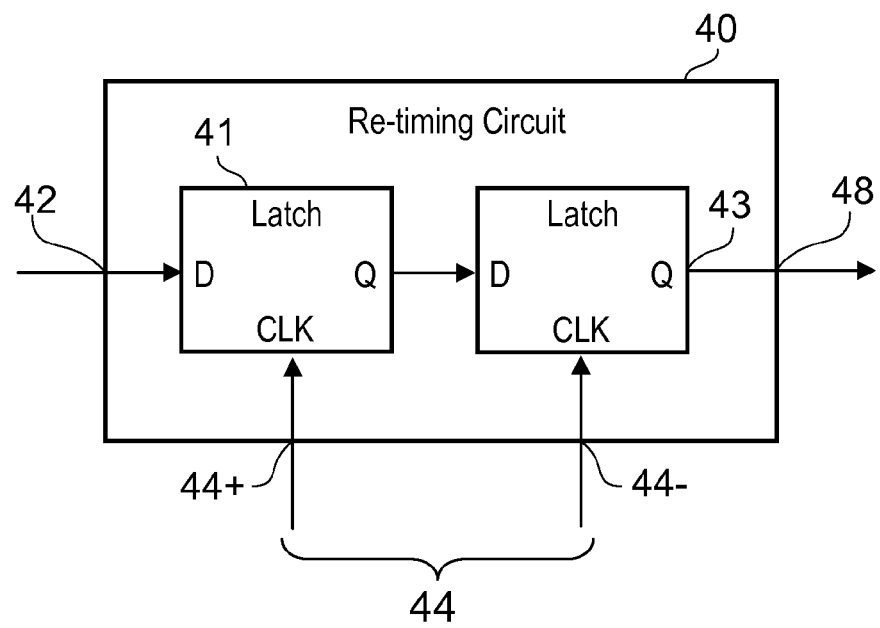
FIG. 8

| | Digital Sequence (decimal value) | | | | | | | | |
|---|---|---|---|---|---|---|---|---|---|
| | 99 | 231 | 198 | 462 | 396 | 924 | 792 | 825 | 561 | 627 |
| Chip sample a) | | 1 | 4 | 4 | | | | | | |
| b) | 1 | 3 | 5 | 2 | | | | | 1 | |
| c) | | 1 | 4 | 2 | | | | | | |
| d) | | 3 | 3 | | 1 | | | | | |
| e) | | 4 | 6 | 4 | | | | | | |
| f) | | 1 | 7 | 7 | | | | | | |
FIG. 9
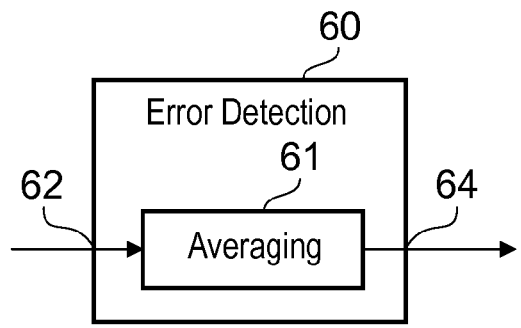
FIG. 10
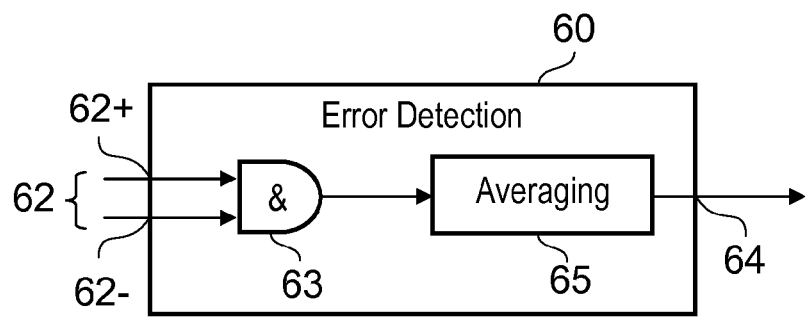
FIG. 11

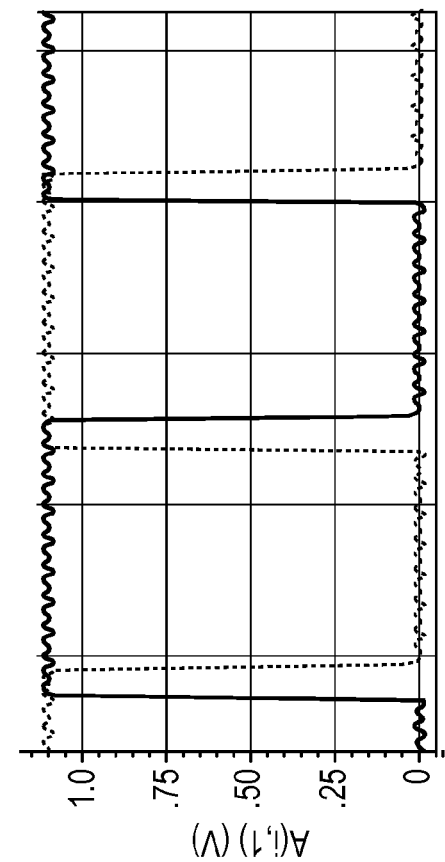
FIG. 14A
FIG. 14B
FIG. 14C
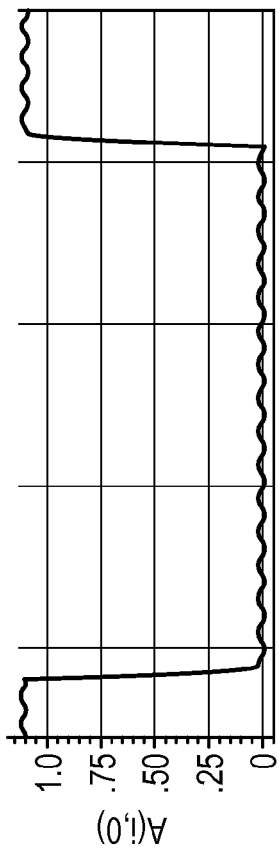
FIG. 15A
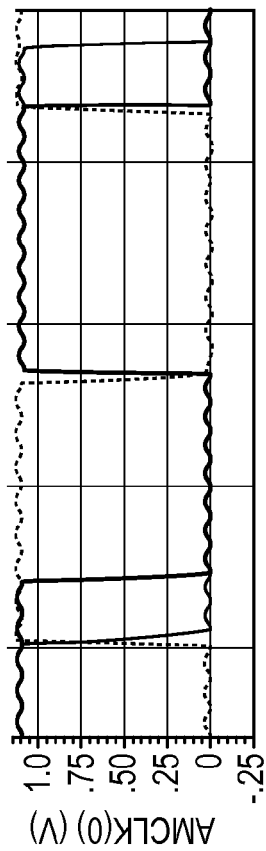
FIG. 15B

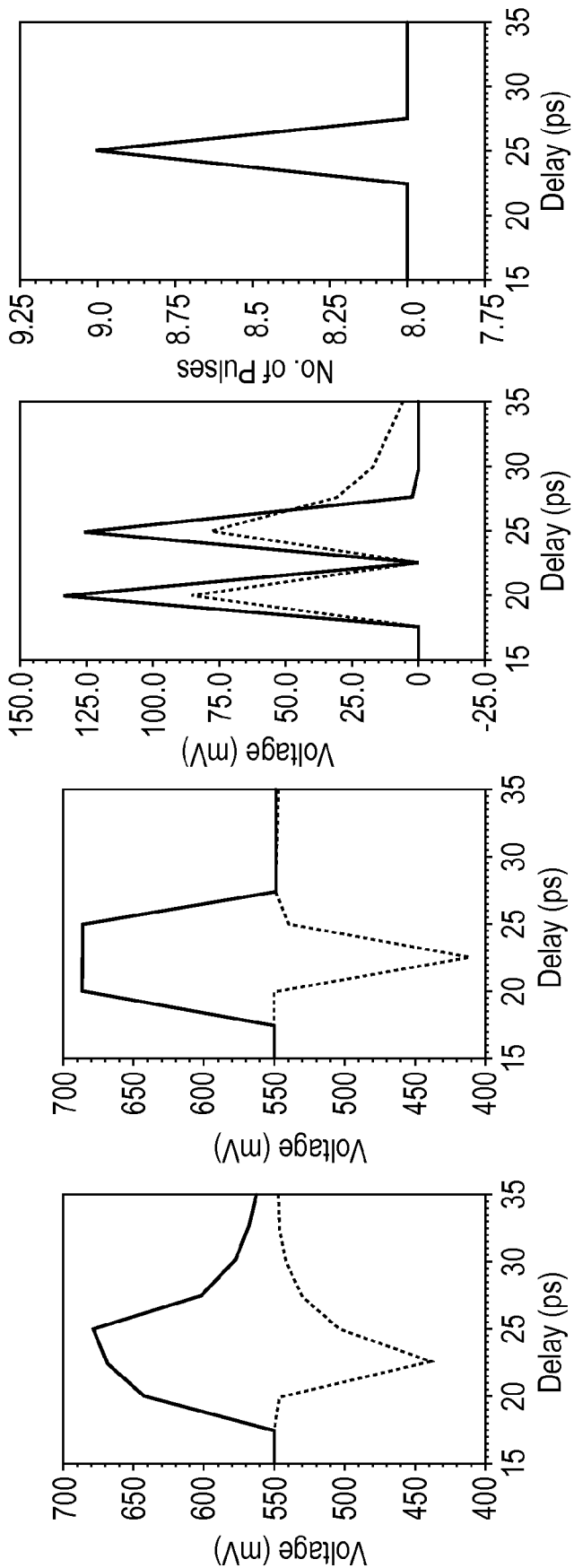

POLAR MODULATOR

FIELD OF THE DISCLOSURE

The present disclosure relates to a polar modulator, a wireless communication apparatus comprising a polar modulator and a method of calibrating a polar modulator. The disclosure has application in, in particular but not exclusively, radio communication equipment.

BACKGROUND TO THE DISCLOSURE

There is a requirement for wireless communication devices to have increased spectral efficiency and reduced power consumption. Advanced modulation schemes can provide increased spectral efficiency, but these can require transmitters that can amplify a signal having a non-constant envelope.

A polar modulator enables a transmitter for a non-constant envelope signal to be implemented in a power-efficient manner. In a polar modulator, a phase component and an amplitude component of a modulation signal are processed separately. A carrier signal is phase modulated by the phase component. The phase modulated carrier signal has constant amplitude, and therefore can be amplified in a power-efficient amplifier. The amplitude modulation is applied to the phase modulated carrier signal after the amplification.

Therefore, there is a requirement for an improved polar modulator.

SUMMARY OF THE PREFERRED EMBODIMENTS

According to a first aspect, there is provided a polar modulator comprising:

a modulation generator arranged to generate phase modulation data and amplitude modulation data;

a phase modulation stage arranged to generate a phase modulated, PM, carrier signal and a PM clock signal, wherein
the PM carrier signal has a PM carrier signal frequency and the PM clock signal has a PM clock signal frequency, and the PM carrier signal frequency is higher than the PM clock signal frequency,
the PM carrier signal and the PM clock signal are phase modulated by the phase modulation data, and
the phase modulation stage comprises an adjustable delay stage arranged to adjust a relative delay between the PM carrier signal and the PM clock signal to a target value;

a re-timing circuit arranged to generate an amplitude modulation, AM, clock signal by re-timing the PM clock signal with the PM carrier signal;

an amplitude modulation stage arranged to employ the AM clock signal to clock the amplitude modulation data into the amplitude modulation stage and arranged to amplitude modulate the PM carrier signal with the amplitude modulation data;

an error detection stage arranged to generate an indication of a magnitude of a first deviation of the AM clock signal from a target condition; and a control stage arranged to select the target value of the relative delay by determining, by controlling the adjustment of the relative delay by the adjustable delay stage, a first value of the relative delay that maximises the magnitude of the first deviation, and applying an offset to the first value of the relative delay.

According to a second aspect there is provided a method of calibrating a polar modulator, comprising:

generating phase modulation data;

generating a phase modulated, PM, carrier signal and a PM clock signal, wherein
the PM carrier signal has a higher frequency than the PM clock signal,
the PM carrier signal and the PM clock signal are phase modulated by the phase modulation data;

generating an amplitude modulation, AM, clock signal by re-timing the PM clock signal with the PM carrier signal;

generating an indication of a magnitude of a first deviation of the AM clock signal from a target condition;

adjusting a relative delay between the PM carrier signal and the PM clock signal to determine a first value of the relative delay which maximises the magnitude of the first deviation;

selecting a target value of the relative delay by applying an offset to the first value of the relative delay; and adjusting the relative delay to the target value.

Therefore, a value of the relative delay between the PM carrier signal and the PM clock signal which maximises the deviation of the of the AM clock signal from a target condition is determined, and a target value of the relative delay is selected which is offset from this determined value. This can reduce the time required to select the target value of the relative delay, and increase the reliability of the target value, when the target condition is a result of an infrequent event, by determining initially a value of the relative delay between the PM carrier signal and the PM clock signal which results in a more frequent event which can be determined more quickly and with greater reliability, and then selecting the target value of the relative delay, offset from the determined value. The offset value of the relative delay selected as the target value can therefore result in the AM clock signal satisfying the target condition.

The error detection stage may be arranged to generate an indication of a magnitude of a second deviation of the AM clock signal from the target condition, wherein the first deviation and the second deviation have opposite polarities; and the control stage may be arranged to determine a second value of the relative delay which maximises the magnitude of the second deviation and may be arranged to select the offset in the range 40% to 60% of a difference between the first and second values of the relative delay. Likewise, the method may comprise generating an indication of a magnitude of a second deviation of the AM clock signal from the target condition, wherein the first deviation and the second deviation have opposite polarities; and determining a second value of the relative delay which maximises the magnitude of the second deviation and selecting the offset in the range 40% to 60% of a difference between the first and second values of the relative delay. Therefore, the first and second values of the relative delay may be determined which result in positive and negative, or vice versa, maximum deviations of the AM clock signal from the target condition, and the target value of the relative delay may be selected substantially mid-way between the first and second values of the relative delay, where the deviation of the AM clock signal from the target condition can be close to zero. This feature can result in a more reliable target value of the relative delay.

The offset may be in the range 40% to 60% of the period of the PM carrier signal. Therefore, where the deviation of the AM clock signal from the target condition is caused by an undesired timing relationship of signals, including the PM carrier signal, which is a periodic signal, the offset may be substantially half of the period of the PM carrier signal. This feature can provide a simple way of selecting the offset as a constant value.

The target condition may be a duty cycle of fifty percent. Timing errors can result in the AM clock signal having a duty cycle that deviates from a target value of 50%. In this case, the first and/or second deviation may indicate by how much the duty cycle of the AM clock signal deviates above or below 50%. This feature enables low complexity determination of the first and/or second deviation.

The error detection stage may be arranged to generate the indication of magnitude as an average value of the AM clock signal. Likewise, the method may comprise generating the indication of magnitude as an average value of the AM clock signal. An indication of the average value of the AM clock signal may be provided with low complexity, thereby enabling determination of the first and/or second deviation with low complexity.

The AM clock signal may have a differential format comprising a first differential component and a second differential component, and the target condition may be simultaneous switching of polarity of the first and second differential components. The differential format and this target condition enable the deviation, and the magnitude of the deviation, from the target condition of the AM clock signal to be determined with low complexity.

The error detection stage may be arranged to generate the indication of magnitude as an average value of a logical AND function of the first and second differential components of the AM clock signal. Likewise, the method may comprise generating the indication of magnitude as an average value of a logical AND function of the first and second differential components of the AM clock signal. This feature enables low complexity implementation of the error detection stage.

The re-timing circuit may comprise a latch arranged to re-time the PM clock signal with the PM carrier signal by latching the PM clock signal with an edge of the PM carrier signal. Likewise, the method may comprise re-timing the PM clock signal with the PM carrier signal by latching the PM clock signal with an edge of the PM carrier signal. This feature enables low complexity implementation of the re-timing circuit.

The adjustable delay stage may be arranged to adjust the relative delay between the PM carrier signal and the PM clock signal by means of a digital sequence generator arranged to adjust at least one of a phase and a duty cycle of the PM carrier signal. Likewise, the method may comprise adjusting the relative delay between the PM carrier signal and the PM clock signal by means of a digital sequence generator arranged to adjust at least one of a phase and a duty cycle of the PM carrier signal. The use of a digital sequence generator provides a reproducible, reliable and low complexity implementation of the adjustable delay stage.

The digital sequence generator may be arranged to generate a plurality of digital sequences each corresponding to a different combination of phase and duty cycle of the PM carrier signal, and the control stage may comprise a look-up table mapping each of the digital sequences to a value of the relative delay. Likewise, the method may comprise adjusting at least one of the phase and the duty cycle of the PM carrier signal by selecting one of a plurality of digital sequences each corresponding to a different combination of phase and duty cycle of the PM carrier signal, and employing a look-up table mapping each of the digital sequences to a value of the relative delay. Such a look-up table provides a low complexity way of determining a target value of the digital sequence from a target value of the relative delay to be provided by the adjustable delay stage.

The adjustable delay stage may be arranged to adjust the relative delay between the PM carrier signal and the PM clock signal by varying at least one of a supply voltage and a supply current of the digital sequence generator. Likewise, adjusting the relative delay between the PM carrier signal and the PM clock signal may comprise varying at least one of a supply voltage and a supply current of the digital sequence generator. This feature can enable the target value of the relative delay provided by the adjustable delay stage to be determined more reliably by enabling the relative delay to be controlled in smaller increments than provided by varying solely the digital sequence.

The PM carrier signal frequency may be at least eight times the PM clock signal frequency. Whereas the PM carrier signal frequency may be determined by a desired transmission frequency, the use of a lower frequency for the PM clock signal can reduce power consumption and yet provide a sufficient sample rate for the amplitude and phase modulation data. Alternatively, a smaller ratio between the PM carrier signal frequency and the PM clock signal frequency may be used.

The modulation generator may generate the phase modulation data and the amplitude modulation data at a rate dependent on the PM clock signal frequency. Likewise, the method may comprise generating the phase modulation data and the amplitude modulation data at a rate dependent on the PM clock signal frequency. This facilitates synchronisation of the amplitude modulation data with the phase modulation data.

According to a third aspect there is provided a transmitter comprising a polar modulator according to the first aspect.

According to a fourth aspect there is provided a wireless communication apparatus comprising a polar modulator according to the first aspect.

BRIEF DESCRIPTION OF THE DRAWINGS

Preferred embodiments will now be described, by way of example only, with reference to the accompanying drawings, in which:

FIG. 4 illustrates digital sequences generated by a direct digital synthesiser;

FIG. 6 is a chart illustrating the dependence of timing errors on voltage supply and on digital sequence;

FIG. 7 is a block schematic diagram of a re-timing circuit;

FIG. 8 is a block schematic diagram of an alternative re-timing circuit;

FIG. 9 is a chart illustrating the dependence of timing errors on the digital sequence for different samples of an integrated circuit polar modulator;

FIG. 10 is a block schematic diagram of an error detection stage;

FIG. 11 is a block schematic diagram of an alternative error detection stage;

FIG. 14 illustrates computer simulated waveforms of amplitude modulation data and an AM clock signal with and without timing errors;

FIG. 15 illustrates computer simulated waveforms of amplitude modulation data with and without timing errors;

FIGS. 17 to 19 illustrates graphs of an error signal for a range of relative delay values and for different embodiments of the error detection stage;

FIG. 20 illustrates a count of pulses for a range of relative delay values, and

DETAILED DESCRIPTION OF PREFERRED EMBODIMENTS

Figure 1:
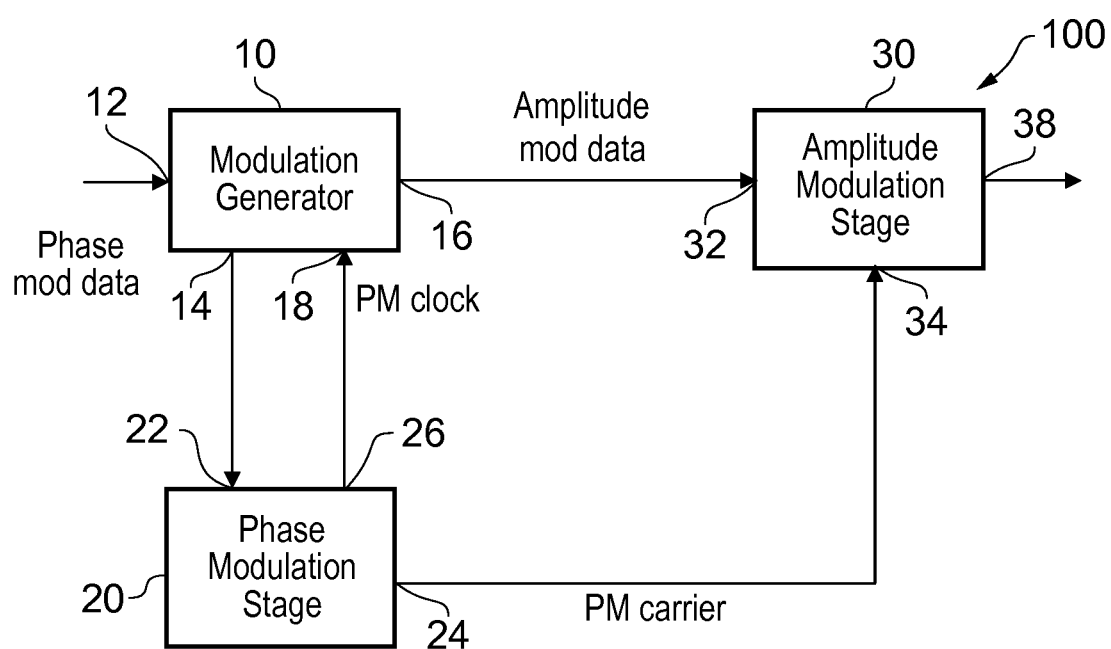
FIG. 1 is a block schematic diagram of a polar modulator.

Referring to FIG. 1, a polar modulator 100 suitable for implementation using digital circuitry comprises a modulation generator 10 that has a first input 12 for receiving data to be transmitted. The modulation generator 10 generates, from the data to be transmitted, amplitude modulation data and phase modulation data of a modulation signal in a digital form. A first output 14 of the modulation generator 10 is coupled to an input 22 of a phase modulation stage 20 for delivering the phase modulation data. The phase modulation stage 20 phase modulates a carrier signal with the phase modulation data, and delivers a phase modulated (PM) carrier signal at a first output 24 of the phase modulation stage 20. A second output 16 of the modulation generator 10 is coupled to a first input 32 of an amplitude modulation stage 30 for delivering the amplitude modulation data. The first output 24 of the phase modulation stage 20 is coupled to a second input 34 of the amplitude modulation stage 30 for delivering the PM carrier signal to be amplitude modulated with the amplitude modulation data by the amplitude modulation stage 30. The phase modulation data and the amplitude modulation data are generated by the modulation generator 10 at a rate that is determined by a phase modulated clock signal, referred to as a PM clock signal. The PM clock signal is generated by the phase modulation stage 20, and may be derived from an oscillator that generates the carrier signal within the phase modulation stage 20. The carrier signal has a frequency of, for example, 2.4 GHz and the PM clock signal has a frequency, or more specifically a centre frequency, of, for example, 300 MHz. A second output 26 of the phase modulation stage 20 for delivering the PM clock signal is coupled to a second input 18 of the modulation generator 10. An output 38 of the amplitude modulation stage 30 delivers the phase and amplitude modulated carrier signal for transmission.

The spectral purity of the phase and amplitude modulated carrier signal can be controlled by controlling the relative timing of the phase modulation data and the amplitude modulation data. However, uncertainty in delays, particularly in the generation of the phase and amplitude modulation data and in the generation of the PM carrier signal and PM clock signal, can result in spectral impurity. If the amplitude modulation stage 30 comprises a latch to latch the amplitude modulation data present at the first input 32 of the amplitude modulation stage 30 with an edge of the PM carrier signal present at the second input 34 of the amplitude modulation stage 30, a particular problem can arise if a change in the amplitude modulation data coincides with a transition in the PM carrier signal, which can introduce an uncertainty in the time of the latching corresponding to a cycle, or period, of the PM carrier signal. Therefore, the amplitude modulation data can sometimes be latched into the amplitude modulation stage 30 late. The present disclosure addresses, in particular, the timing aspects of such a polar modulator.

Figure 2:
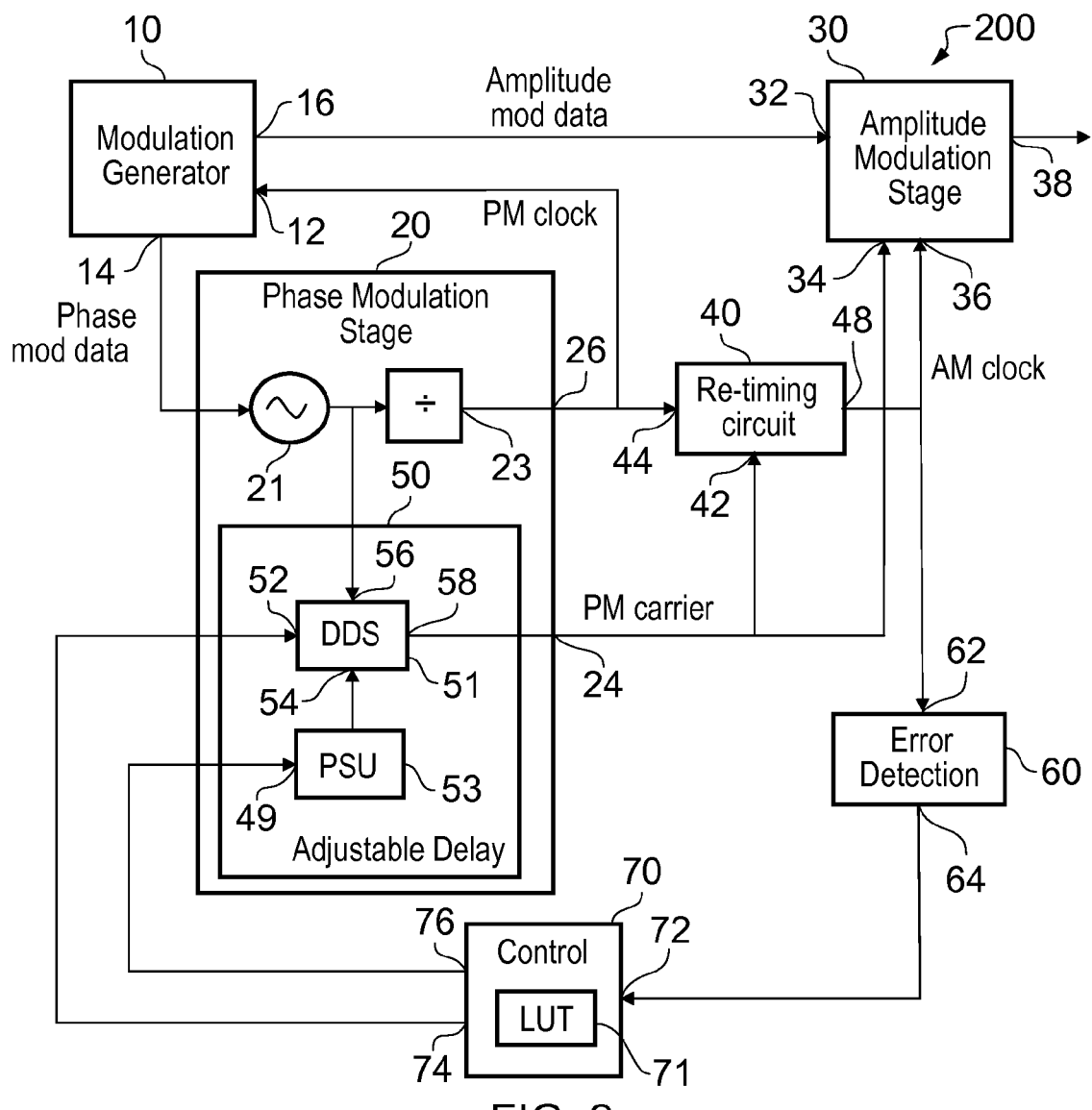
FIG. 2 is a more detailed block schematic diagram of a polar modulator.

Referring to FIG. 2, a polar modulator 200 comprises the modulation generator 10, the phase modulation stage 20 and the amplitude modulation stage 30 described above with reference to FIG. 1, and coupled together as described above. The architecture and operation of these elements are described below in more detail. The polar modulator 200 of FIG. 2 additionally comprises a re-timing circuit 40, an error detection stage 60 and a control stage 70.

The re-timing circuit 40 has a first input 42 coupled to the first output 24 of the phase modulation stage 20 for receiving the PM carrier signal, and a second input 44 coupled to the second output 26 of the phase modulation stage 20 for receiving the PM clock signal. The re-timing circuit re-times, that is adjusts, transitions in the PM clock signal to coincide with transitions in the PM carrier signal, and delivers the re-timed signal, referred to as an amplitude modulation (AM) clock signal, at an output 48 of the re-timing circuit 40. The AM clock signal has a frequency, or more specifically a centre frequency, that is the same as the centre frequency of the PM clock signal, which in this example is 300 MHz. The output of the re-timing circuit 40 is coupled to a third input 36 of the amplitude modulation stage 30 and an input 62 of the error detection stage 60.

The phase modulation stage 20 comprises a digitally controlled oscillator (DCO) 21 having an input coupled to the first output 14 of the modulation generator 10. The DCO 21 generates a DCO signal having a centre frequency of 12 GHz, and the phase of the DCO signal is modulated with the phase modulation data. An output of the DCO 21 is coupled to a divider 23 that divides the DCO signal by forty and delivers to the second output 26 of the phase modulation stage 26 the PM clock signal having a centre frequency of 300 MHz.

Figure 3:
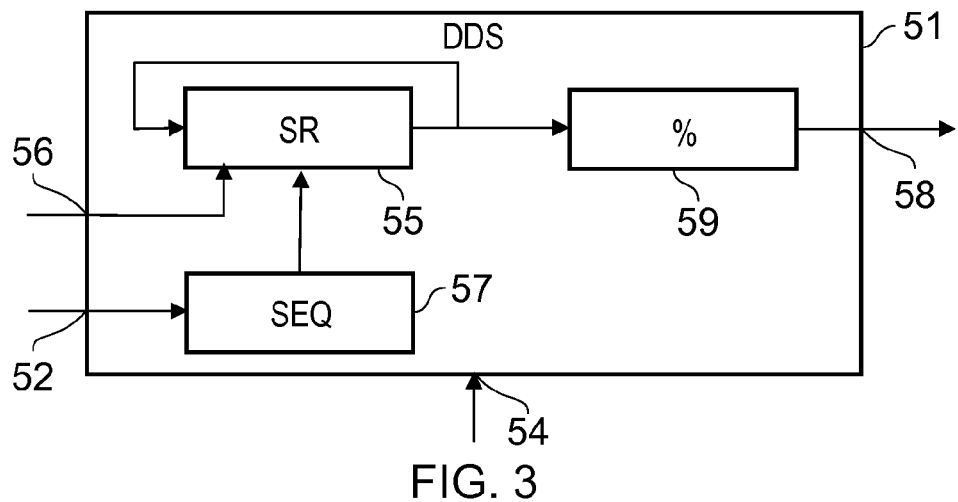
FIG. 3 is a block schematic diagram of a direct digital synthesiser.

The phase modulation stage 20 also comprises an adjustable delay stage 50 comprising a direct digital synthesiser (DDS) 51 and a controllable power supply (PSU) 53. The output of the DCO 21 is coupled to an input 56 of the DDS 51. Referring to FIG. 3, the DDS 51 comprises a shift register (SR) 55 having a clock input coupled to the input 56 of the DDS 51 and having an output coupled to an input of the shift register 55 so that a digital sequence in the shift register circulates when the shift register 55 is clocked by the DCO signal. For example, with a 10-stage shift register containing a 10-bit digital sequence, and the DCO signal having a centre frequency of 12 GHz, the digital sequence circulates at a frequency of 1.2 GHz. The DDS 51 has a sequence selector (SEQ) 57 having an input coupled to a control input 52 of the DDS 51 for selecting a digital sequence, and an output coupled to a loading input of the shift register 55 for loading the selected digital sequence into the shift register.

The frequency, phase and duty cycle of the signal at the output of the shift register is dependent on the sequence that is loaded into the shift register. Referring to FIG. 4, the first row contains a bit number 0 to 9 representing each stage of the 10-stage shift register, the second row contains a corresponding decimal value of each of the ten stages when set to a binary '1'. The ten digital sequences that can be loaded into the shift register are displayed as ten rows. Each of the ten digital sequences comprises a 5-bit sequence twice, when considered cyclically, and so the 5-bit sequence repeats once every five cycles of the DCO signal, providing division by five. The ten digital sequences provide five different phases and two different duty cycles that provide a range of delay increments spanning a cycle, or period, of the PM clock signal. In general, the range of delay increments preferably spans at least 90%, and more preferably 100%, of a period of the PM clock signal. The penultimate column shows the duty cycle of each of the ten digital sequences. For example, the first digital sequence is 1100011000, and therefore provides a duty cycle of 40%. The column preceding the penultimate column displays the equivalent decimal value of each of the ten digital sequences, and these decimal values can be provided at the control input 52 of the DDS 51 for selecting one of the ten digital sequences. Alternatively, the ten digital sequences can be stored in the DDS 51, with each being selected with a different value at the control input 52 of the DDS 51. The final column of FIG. 4 shows the delay increments, as a proportion of the period of the PM clock signal. The DDS 51 also comprise a duty cycle adjustment stage (%) 59 coupled to the output of the shift register 55 to convert the duty cycle of the digital sequence to 50%, for example by advancing and retarding rising and falling edges of the digital sequence. Referring again to FIGS. 2 and 3, an output of the duty cycle adjustment stage 59 is coupled to an output 58 of the DDS 51 for delivering the PM carrier signal, and the output 58 of the DDS 51 is coupled to the first output 24 of the phase modulation stage 20. Therefore, the PM carrier signal is delivered at the first output 24 of the phase modulation stage 20 and comprises a selected one of the ten digital sequences, repeated and adjusted to have a 50% duty cycle. The five different phases of the digital sequences enable the timing of the PM carrier signal to be adjusted in increments corresponding to one cycle of the DCO signal, or equivalently one fifth of a cycle of the PM carrier signal. For example, when the PM carrier signal has a frequency of 2.4 GHz, the frequency of the DCO signal is 12 GHz, and the timing increment is 83.3 ps.

Referring again to FIG. 2, the PSU 53 is coupled to a power supply input 54 of the DDS 51 for providing a voltage and/or current to the DDS 51. The voltage and/or current is/are selectable by means of a control input 49 of the PSU 53. By changing the voltage and/or current, the rise and fall times of the PM carrier signal can be controlled, thereby adjusting the timing of transitions in the PM carrier signal. The range of this adjustment is, in this example, approximately 40 ps.

The error detection stage 60 has an input 62 coupled to the output 48 of the re-timing circuit, for receiving the AM clock signal, and an output 64 coupled to an input 72 of the control stage 70 for delivering an indication, which is an error signal, of a magnitude of a deviation of the AM clock signal from a target condition. The control stage 70 has a first output 74 coupled to the control input 52 of the DDS 51, and a second output 76 coupled to the control input 56 of the PSU 53. The control stage 70 selects which of the ten digital sequences is loaded into the shift register of the DDS 51, selects the voltage and/or current provided by the PSU 51, and thereby controls the delay provided by the adjustable delay 50. In this way, the control stage 70 controls the relative delay between the PM carrier signal and the PM clock signal. By controlling the relative delay between the PM carrier signal and the PM clock signal, and monitoring the indication delivered by the error detection stage 60, that is, the error signal, as described in more detail below, the controller 70 calibrates the polar modulator 200 by determining and selecting a target value of the delay provided by the adjustable delay stage 50. The target value of the delay provided by the adjustable delay stage 50 may be considered to be an operating value of the delay provided by the adjustable delay stage 50, resulting from the calibration of the polar modulator 200 and used for operation of the polar modulator 200 after the calibration.

Figure 5:
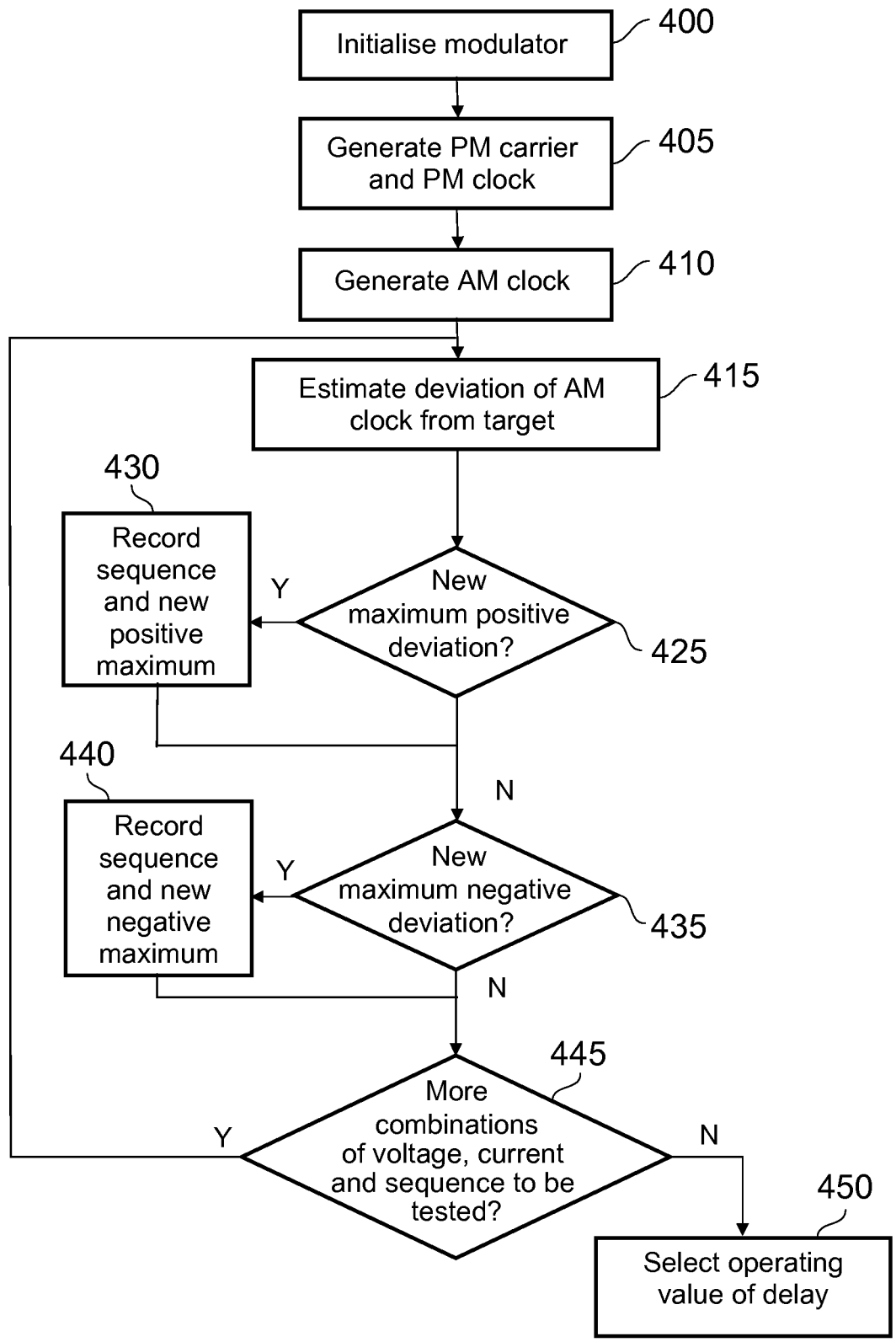
FIG. 5 is a flow chart of a method of calibrating a polar modulator.

Referring to FIG. 5, a method of calibrating the polar modulator 200 commences at step 400 by initialising the polar modulator 200. The initialisation is under the control of the control stage 70, and comprises selecting phase modulation data and amplitude modulation data to be used during the calibration, selecting initial values of the voltage and current supplied by the PSU 53, selecting an initial value of the digital sequence in the DDS 51, initialising variables required for the calibration method, and inhibiting the output 38 of the amplitude modulation stage 30 so that, during the calibration, power is not emitted from an antenna to which the polar modulator 200 may be coupled. The output power may be set to zero for the calibration by setting the amplitude modulation data to zero. Flow then proceeds to step 405 where the PM carrier signal and the PM clock signal are generated by the phase modulation stage 20, which results in the modulation generator 10 generating the phase modulation data and the amplitude modulation data. Flow then proceeds to step 410 where the AM clock signal is generated by the re-timing circuit 40, and the amplitude modulation stage 30 uses the AM clock signal to clock the amplitude modulation data into the amplitude modulation stage 30.

Then, at step 415, a looped procedure commences in which the error detection stage 60 estimates a deviation the AM clock signal from a target condition, and generates the indication of a magnitude of the deviation of the AM clock signal from the target condition. Embodiments of the error detection stage and different target conditions are described below.

At step 425, the control stage 70 tests whether the current deviation estimated in step 415 exceeds a previously recorded positive value of the deviation, held in a first variable, and if so, at step 430 sets the first variable to the current value of the deviation and a second variable to the value of the current digital sequence, and if not, at step 435 tests whether the deviation estimated in step 415 is less than a previously recorded negative value of the deviation, held in a third variable, and if so, at step 440 sets the third variable to the current value of the deviation and a fourth variable to the value of the current digital sequence. The first and second variables are initialised to zero during the initialisation at step 400.

From step 440 or step 435, flow proceeds to step 445 where a test is performed to determine whether the looped procedure has been completed for all combinations of values of the current and voltage supplied by the PSU 53 and digital sequences generated by the DDS 52. The values of the current and voltage supplied by the PSU 53 provide interpolation of the delay values provided by the DDS 51, that is, enable values of delay intermediate the delay values provided by the DDS 51. If the looped procedure has not been completed for all such possible combinations, at step 445 another combination of the current, voltage and digital sequence is selected and flow returns to step 415 to perform a new iteration of the looped procedure with the new combination. Completion of the looped procedure for all such possible combinations results in the determination, in the first and third variables, of the maximum and minimum values of the deviation estimated at step 415, and, in the second and fourth variables, of the corresponding digital sequences.

When the looped procedure has been completed for all possible combinations of the current, voltage and digital sequence, flow proceeds to step 450 where the control stage 70 selects a target value for the digital sequence in the DDS 51, and therefore a target value for the delay provided by the adjustable delay stage. A digital sequence is selected, for the target value in the DDS 51, which provides a delay in the adjustable delay stage 50 offset from the delay provided by the digital sequence stored in the second variable and offset from the delay provided by the digital sequence stored in the fourth variable. For example, the target value of the digital sequence selected for the DDS 51 may correspond to a digital sequence that provides a delay substantially mid-way, for example in the range 40% to 60%, between the delay provided by the digital sequence stored in the second variable and the delay provided by the digital sequence stored in the fourth variable. To enable this selection of the target value of the delay and digital sequence, the control stage 70 comprises a look-up table 71 that maps, that is relates, each of the digital sequences to a value of the delay provided by the adjustable delay stage 50. For example, the control stage 70 may read the digital sequences stored in the second and fourth variables, employ the look-up table 71 to determine corresponding delay values, calculate the required offset delay value, and employ the look-up table 71 to determine a digital sequence which will provide the required offset delay value. In FIG. 4, the final column provides an example of the delay values, as a proportion of the period of the PM carrier signal, ranging from zero to 0.9 in increments of 0.1.

Referring to FIG. 7, a first embodiment of the re-timing circuit 40 comprises a rising edge latch 41 having a data input (D) coupled to the first input 42 of the re-timing circuit 40, a data output (Q) coupled to the output 48 of the re-timing circuit 40, and a clock input (CLK) coupled to the second input 44 of the re-timing circuit 40. The PM clock signal at the first input 42 of the re-timing circuit 42 is transferred to the output 48 of the re-timing circuit 40 at the next rising edge of the PM carrier signal applied at the second input 44 of the re-timing circuit 40. However, if a transition in the PM clock signal occurs at the same, or almost the same, time as the rising edge of the PM carrier signal, that transition may not be transferred to the output 48 of the re-timing circuit 40 until a rising edge of the PM carrier signal one period later of the PM carrier signal. Therefore, an extra delay is inserted in the AM clock signal, thereby causing a timing error in the AM clock signal, which can result in timing jitter in the amplitude modulation performed by the amplitude modulation stage 30, and in particular a timing mismatch between the phase modulation and the amplitude modulation. Such a timing error, timing jitter or timing mismatch can give rise to undesirable spectral impurity in the amplitude and phase modulated carrier signal at the output 38 of the amplitude modulation stage 30.

Referring to FIG. 8, a second embodiment of the re-timing circuit 40, which can be used when the PM carrier signal has a differential format, comprises, in addition to the rising edge latch 41 described with reference to FIG. 3, a falling edge latch 43 coupled between the data output Q of the latch 41 and the output 48 of the re-timing circuit 40. The second input 44 of the re-timing circuit 40 has positive differential component 44+ and a negative differential component 44−. The clock input of the rising edge latch 41 is coupled to the positive differential component 44+ of the second input 44 of the re-timing circuit 40. The falling edge latch 43 has a data input (D) coupled to the data output Q of the rising edge latch 41, a data output (Q) coupled to the output 48 of the re-timing circuit 40, and a clock input (CLK) coupled to the negative differential component 44− of the second input 44 of the re-timing circuit 40. In this second embodiment of the re-timing circuit 40, the PM clock signal at the first input 42 of the re-timing circuit 42 is transferred to the data input D of the falling edge latch 43 at each rising edge of a positive differential component of the PM carrier signal applied at the second input 44 of the re-timing circuit 40, and is transferred to the output 48 of the re-timing circuit 40 at each rising edge of the negative differential component of the PM carrier signal applied at the second input 44 of the re-timing circuit 40. However, if a transition in the PM clock signal occurs at the same, or almost the same, time as the rising edge of the PM carrier signal, either or both of these transfers may not take place until an edge of the PM carrier signal one period later of the PM carrier signal. As in the case of the first embodiment of the re-timing circuit 40, extra delay is inserted in the AM clock signal, thereby causing a timing error in the AM clock signal, which can result in timing jitter in the amplitude modulation performed by the amplitude modulation stage 30, and in particular a timing mismatch between the phase modulation and the amplitude modulation. Again, such a timing error, timing jitter or timing mismatch can give rise to undesirable spectral impurity in the amplitude and phase modulated carrier signal at the output 38 of the amplitude modulation stage 30.

In a variation of the polar modulator 200, the input 62 of the error detection stage 60, rather than being coupled to the output 48 of the re-timing circuit 40 described with reference to FIG. 8, can instead be coupled to the data output (Q) of the rising edge latch 41 of the re-timing circuit 40 described with reference to FIG. 8. This corresponds to coupling the input 62 of the error detection stage 60 to the output 48 of the re-timing circuit 40 described with reference to FIG. 7.

Occurrence of the timing error can be reduced or eliminated by appropriate selection of the delay provided by the adjustable delay stage 50. However, the timing error may not be consistently the same in all implementations of the polar modulator 200, and so a calibration arrangement is desirable for selecting an appropriate delay, or correspondingly an appropriate value for the digital sequence in the DDS 51. Where the polar modulator 200 is implemented in an integrated circuit, the timing error may vary from chip to chip. FIG. 9 shows, for six chip samples a) to f), and for each of the values of the digital sequence in the DDS 51, a number of times spectral impurity was found to be present when amplitude and phase modulated carrier signal generated by each chip sample was measured 100 times. An appropriate value of the digital sequence for reducing or eliminating the occurrence of the timing error, for these chip samples, is decimal 792 as this value is furthest from the values at which the timing error occurs most frequently, although other values may be more appropriate for other chip samples.

An iterative approach to calibration may be taken to determining an appropriate value of the delay and digital sequence, loading each of the digital sequences in turn into the DDS 51 and counting the occurrence of timing errors. However, as timing errors can be infrequent events, determining the occurrence of timing errors, or rather the lack of timing errors, as the optimum value of the digital sequence is approached, can be slow. Therefore, an alternative approach is used in which iteration is used to determine an inappropriate value of the delay and digital sequence that results in a high occurrence of timing errors, and then a target value of the delay and digital sequence is selected offset from the inappropriate value, where the offset is selected to ensure, or to provide a high probability that, the target value will result in infrequent, or zero, timing errors. In one embodiment, a single value of the delay and digital sequence that results in a high occurrence of timing errors is determined, and then a target value of the delay and digital sequence is selected offset from the inappropriate value. Typically, such an offset can be in the range 40% to 60% of the period of the PM carrier signal. In another embodiment, two values of the delay and digital sequence that results in a high occurrence of timing errors are determined, corresponding to a positive and a negative deviation of the AM clock signal from the target condition, and then a target value of the delay is selected substantially mid-way between these two values, that is, in the range 40% to 60% from both of these values.

Referring to FIG. 10, a first embodiment of the error detection stage 60 comprises an averaging stage 61 having an input coupled to the input 62 of the error detection stage 60 and an output coupled to the output 64 of the error detection stage 60. The averaging stage 61, by averaging the AM clock signal, generates at its output an indication of the duty cycle of the AM clock signal. In the absence of the timing errors described above, the AM clock signal has a target duty cycle, such as 50%. The target duty cycle is one example of a target condition of the AM clock signal. Where the AM clock signal is a two-level signal having a target duty cycle of 50%, its average value is midway between the two levels of the AM clock signal. A timing error will cause the duty cycle of the AM clock to deviate from the target duty cycle, and therefore cause the average value of the AM clock signal to deviate from midway between the two levels of the AM clock signal by an amount indicative of the duty cycle. An indication of the deviation, comprising both sign and magnitude, of the duty cycle of the AM clock from the target duty cycle is delivered as the error signal at the output 64 of the error detection stage 60.

Referring to FIG. 11, a second embodiment of the error detection stage 60 comprises a logical AND gate 63 and an averaging stage 65. The input 62 of the error detection stage 60 has a differential format comprising positive and negative differential components 62+, 62− for receiving the AM clock in a differential format, and these positive and negative differential components 62+, 62− are coupled to respective first and second inputs of the AND gate 63. An output of the AND gate 63 is coupled to the input of the averaging stage 65, and an output of the averaging stage 65 is coupled to the output 64 of the error detection stage 60. In the absence of timing errors, differential components of the AM clock will have simultaneous, but opposite, polarity changes, that is, a transition in a positive differential component of the AM clock from a minimum value to a maximum value will occur simultaneously to a transition in a negative differential component of the AM clock from a maximum value to a minimum value. The occurrence of these transitions simultaneously is another example of a target condition of the AM clock signal. Under this target condition, the output of the AND gate 63 will be at a logical zero. The occurrence of a timing error will cause these transitions to be no longer simultaneous, and the output of the AND gate 63 will deliver a pulse whose duration is indicative of the magnitude of the deviation of the AM signal from the target condition. A sign, that is, polarity or direction, of the pulse is indicative of the sign of the deviation of the AM signal from the target condition, that is, indicative of which of the differential components of the AM clock signal have the earlier transition. The averaging stage 65 forms an indication of the average value and the sign of the pulse at the output of the AND gate 63, and delivers the indication as the error signal at the output 64 of the error detection stage 60.

Figure 12:
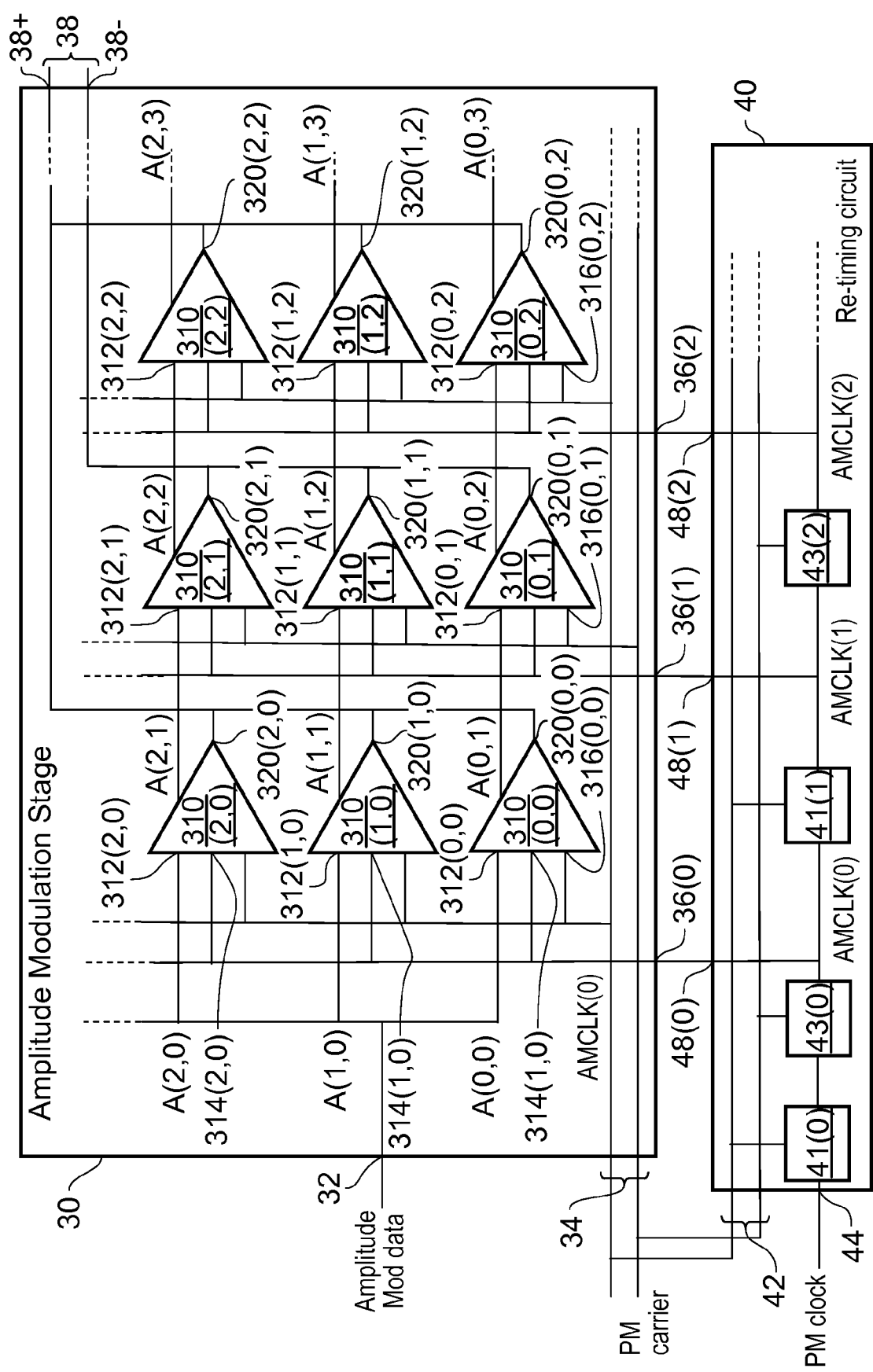
FIG. 12 is a block schematic diagram of an amplitude modulation stage.

Referring to FIG. 12, an embodiment of the amplitude modulation stage 30 and a third embodiment of the re-timing circuit 40 are illustrated. The amplitude modulation data is provided to the first input 32 of the amplitude modulation stage 30 as a stream of words, each word comprising N bits, where N can be, for example, 5, 6 or 8, although other values of N can be used. The amplitude modulation stage 30 of FIG. 11 comprises an array of cells $310(i,j)$ which provide amplification and digital-to-analogue conversion. Each of the cells $310(i,j)$ receives a bit of the words of the amplitude modulation data, and for each bit which has a binary '1' value, produces a stream of pulses at the frequency of the PM clock signal. For example, where the PM clock signal has a frequency eight times the frequency of the AM clock signal, each bit of the amplitude modulation data which has a binary '1' value will result in a stream of eight pulses at the frequency of the PM clock signal at the output 38 of the amplitude modulation stage 30. Interpolation is provided by delaying the amplitude modulation data in increments corresponding to half a period of the PM clock signal. The streams of pulses are summed on an output bus and delivered at the output 38 of the amplitude modulation stage 30. The index i designates which bit of the word of the amplitude modulation data the cells $310(i,j)$ process, and the index j designates the number of increments of delay that has been applied to the bit of the word of the amplitude modulation data that the cells $310(i,j)$ process. Therefore, the index i has a range 0 to N−1, and the index j has a range 0 to M, where M is the maximum number of delay increments, for example 16. In FIG. 12, the bits of the amplitude modulation data words are represented as an array A(i,j), where the index i designates different bits of the amplitude modulation data word, and the index j designates the number of increments of delay that has been applied to the bit of the amplitude modulation data word.

Figure 13:
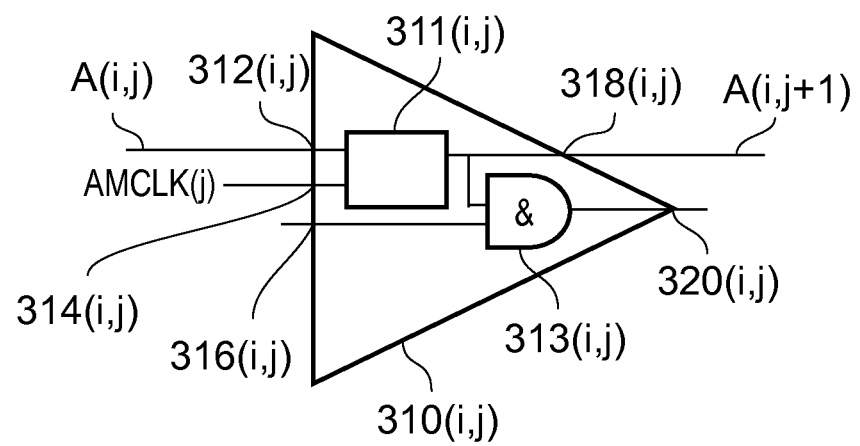
FIG. 13 is a block schematic diagram of a cell of an amplitude modulation stage.
Figure 16A:
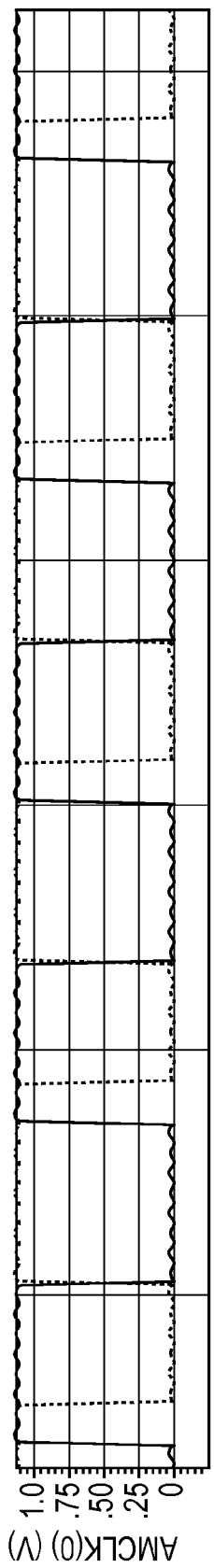
FIG. 16 illustrates computer simulated waveforms in an amplitude modulation stage with and without timing errors.
Figure 16B:
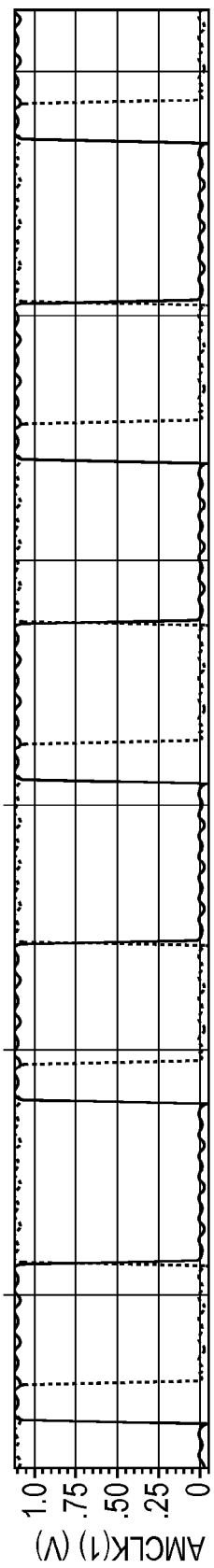
Figure 16C:
Figure 16D:
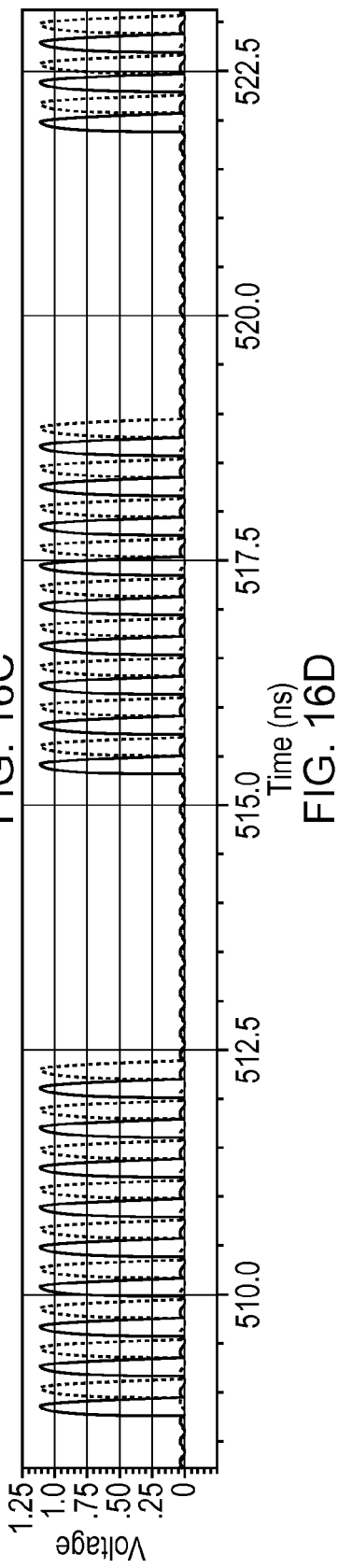

Each of the cells $310(i,j)$ has an identical structure, which is illustrated in FIG. 13 for a generic cell $310(i,j)$. Referring to FIG. 13, and also to FIG. 12, the cell $310(i,j)$ has a first input $312(i,j)$, a second input $314(i,j)$, a third input $316(i,j)$, a first output $318(i,j)$ and a second output $320(i,j)$. The cell $310(i,j)$ has a latch $311(i,j)$ and a logical AND gate $313(i,j)$.

A first input of the latch $311(i,j)$ is coupled to the first input $312(i,j)$ of the cell $310(i,j)$ for receiving and latching the data bit A(i,j) of the amplitude modulation data. An output of the latch $311(i,j)$ delivers the latched data bit A(i,j+1) to the first output $318(i,j)$ of the cell $310(i,j)$ and to a first input of the AND gate $313(i,j)$. The initial cells $310(i,0)$, that is, which receive data bits A(i,0) that have not been latched in the amplitude modulation stage 30, have their first inputs $312(i,0)$ coupled to the first input 32 of the amplitude modulation stage 30. Subsequent cells $310(i,j>0)$, that is, which receive data bits A(i,j>0) that have been delayed by latching have their first inputs $312(i,0)$ coupled to the first output $318(i,j)$ of a preceding cell $310(i,j-1)$.

The second input of the latch $311(i,j)$ is coupled to the second input $314(i,j)$ of the cell $310(i,j)$ for receiving the AM clock signal, which can be supplied in delay increments denoted AMCLK(j). The second input of the AND gate 313 $(i,j)$ is coupled to the third input $316(i,j)$ of the cell $310(i,j)$ for receiving the PM carrier signal. The cells $310(i,j)$ for which j is an even number receive a positive differential component of the PM carrier signal, and cells $310(i,j)$ for which j is an odd number receive a negative differential component of the PM carrier signal. An output of the AND gate $313(i,j)$ is coupled to the second output $320(i,j)$ of the cell $310(i,j)$ for delivering the streams of pulses. The second output $320(i,j)$ of the cells $310(i,j)$ for which j is an even number is coupled to a positive differential component of the output 38 of the amplitude modulation stage 30, which provides a positive differential component of the output of the polar modulator 200. The second output $320(i,j)$ of the cells $310(i,j)$ for which j is an odd number is coupled to a negative differential component of the output 38 of the amplitude modulation stage 30, which provides a negative differential component of the output of the polar modulator 200. The positive and negative components of the output 38 of the amplitude modulation stage 30 function as buses for summing signals at the second outputs 320 $(i,j)$ of the cells $310(j,j)$.

Continuing to refer to FIG. 12, the third embodiment of the re-timing circuit 40 is arranged for receiving the PM carrier signal in a differential format, and comprises, coupled to the second input 44 of the re-timing circuit 40, a chain of rising edge latches 41(j), where the index j has a value zero and odd values, which are clocked by the positive differential component of the PM carrier signal, alternating with falling edge latches 43(j), where the index j has a value zero and even values, which are clocked by the negative differential component of the PM carrier signal. The chain of rising and falling edge latches 41(j), 43(j) forms a delay line, delivering at the outputs of the successive rising and falling edge latches 41(j), 43(j), the AM clock signal successively delayed by half a period of the PM carrier signal. The output of the rising and falling edge latches 41(j), 43(j), except the initial rising edge latch 41(0), are coupled to the second input 314(i,j) of the cells 310(i,j) having the same value of the j index, that is, the successive rising edge latches 41(j) being coupled to the successive cells 310(i,j) for odd values of j, and the successive falling edge latches 43(j) being coupled to the successive cells 310(i,j) for even values of j. The input 62 of the error detection stage 60 can be coupled to the output of any of the rising and falling edge latches 41(j), 43(j).

FIG. 14 graph (a) shows waveforms of the amplitude modulation data bits A(i,0) toggling between a binary '1' and a binary '0' at the inputs of the latches 311(i,0) of the cells 310(i,0). FIG. 14 graphs (b) and (c) illustrate waveforms of the AM clock signal AMCLK(0) delivered at the second inputs 314(i,0) of the cells 310(i,0). Graph (b) illustrates the AM clock signal AMCLK(0) having a timing error, and graph (c) illustrates the AM clock signal AMCLK(0) with the timing error removed by adjustment of the adjustable delay stage 50. The solid lines and the dashed lines in FIG. 14 graphs (a), (b) and (c) show, respectively, the positive and negative differential components. In this example, in graph (b), the timing error causes the falling edge of the negative differential component of the AM clock signal AMCLK(0) to occur late, at a different time to the rising edge of the positive differential component, and the negative differential component has a duty cycle that is not 50%. In graph (c), the transitions of the positive and negative differential components of the AM clock signal AMCLK(0) occur at the same time, and the duty cycle is 50%. In the example of FIG. 14, the timing error does not result in data errors in the amplitude modulation data bits A(i,1) after latching by the latches 311(i,0) of the cells 310(i,0), but does result in the amplitude modulation data bits A(i,1) having a duty cycle that is not 50%.

FIG. 15 graph (a) shows waveforms of the amplitude modulation data bits A(i,1) at the outputs of the latches 311(i,1) of the cells 310(i,1) toggling between a binary '1' and a binary '0' with a timing error, and FIG. 15 graph (b) shows the corresponding waveforms after the timing error has been removed by adjustment of the adjustable delay stage 50. The solid lines and the dashed lines show, respectively, the positive and negative differential components. The timing error causes both components to have a duty cycle that deviates from 50%, with the rising edges of the positive differential component occurring at different times than the falling edges of the negative differential component, and vice versa. After removal of the timing error, both the positive and negative differential components have a duty cycle of 50%, and the transitions in the positive and negative differential components occur simultaneously.

FIG. 16 graphs (a) and (b) show, respectively, the AM clock signals AMCLK (0) and AMCLK (1), provided to successive cells 310(i,0) and 310(i,1), with timing errors that result in the rising edge of the positive differential component and the falling edge of the negative differential component occurring at different times. FIG. 16 graphs (c) and (d) show, respectively, the streams of pulses delivered to the output 38 of the amplitude modulation stage 30 from the second output 320 (i,1) of the cells 310(i,0) and 310(i,1) when the latches 311 (i,0) and 311(i,1) are clocked by, respectively, the AM clock signals AMCLK (0) and AMCLK (1) show in FIG. 16 graphs (a) and (b). The timing error results in streams of nine pulses at the frequency of the PM clock signal, spaced apart by an interval corresponding to seven pulses, and the streams of pulses provided by the cells 310(i,0) and 310(i,1) overlap. This overlap gives rise to spectral impurity at the output 38 of the amplitude modulation stage 30. If the timing error is removed by adjustment of the adjustable delay stage 50, each stream of pulses would comprise eight pulses spaced apart by an interval correspond to eight pulses, as the frequency of the PM clock signal is eight times the frequency of the AM clock signal. In FIG. 16, the waveforms drawn with a solid line represent positive differential components and the waveforms drawn with a dashed line represent negative differential components.

FIG. 17 illustrates, for a range of delay values 15 ps to 35 ps provided by the adjustable delay stage 50, the average value, at the output 64 of the error detection stage 60 described with reference to FIG. 10, of the AM clock signal at the output 48 of the re-timing circuit 40 described with reference to FIG. 7. In FIG. 17, the solid line corresponds to the average value of a positive differential component of the AM clock signal and the dashed line corresponds to the average value of a negative differential component of the AM clock signal. In the absence of a timing error the average value of both the positive and the negative differential components is 550 mV, but where the delay is insufficient to prevent timing errors occurring, the average value reaches about 680 mV for the positive differential component and falls to about 440 mV for the negative differential component.

FIG. 18 illustrates, for a range of delay values 15 ps to 35 ps provided by the adjustable delay stage 50, the average value, at the output 64 of the error detection stage 60 described with reference to FIG. 10, of the AM clock signal at the output 48 of the re-timing circuit 40 described with reference to FIG. 8, which includes the falling edge latch 43, or the output 48(0) of the re-timing circuit 40 described with reference to FIG. 12. In FIG. 18, the solid line corresponds to the average value of a positive differential component of the AM clock signal and the dashed line corresponds to the average value of a negative differential component of the AM clock signal. In the absence of a timing error the average value of both the positive and negative differential components is 550 mV, but where the delay is insufficient to prevent timing errors occurring, the average value reaches about 685 mV for the positive differential component and falls to about 410 mV for the negative differential component.

FIG. 19, solid line, illustrates, for a range of delay values 15 ps to 35 ps provided by the adjustable delay stage 50, the average value, at the output 64 of the error detection stage 60 described with reference to FIG. 11, of the AM clock signal at the output 48 of the re-timing circuit 40 described with reference to FIG. 7 or of the AM clock signal at the output 48 of the re-timing circuit 40 described with reference to FIG. 7, or of the AM clock signal at the output 48(0) of the re-timing circuit 40 described with reference to FIG. 12. In the absence of a timing error the average value is zero, but where the delay is insufficient to prevent timing errors occurring, the average value reaches about 135 mV. The dashed line in FIG. 19 illustrates the average value, at the output 64 of the error detection stage 60 described with reference to FIG. 10, of the AM clock signal at the output 48(1) of the re-timing circuit 40 described with reference to FIG. 12. In the absence of a timing error the average value is zero, but where the delay is insufficient to prevent timing errors occurring, the average value reaches about 85 mV.

FIG. 20 illustrates, for a range of delay values 15 ps to 35 ps provided by the adjustable delay stage 50, the number of pulses at the second output 320(i,j) of the cells 310(i,j) either over two periods of the AM clock signal, or equivalently in each of the streams of pulses. In the absence of a timing error, the number of pulses is eight, as the frequency of the PM clock signal is eight times the frequency of the AM clock signal, but where the delay is insufficient to prevent timing errors occurring, the number of pulses is increased to nine. Indeed, one option for detecting a timing error is to count the number of pulses and determine when the count deviates from a target value, such as eight in this example.

Figure 21:
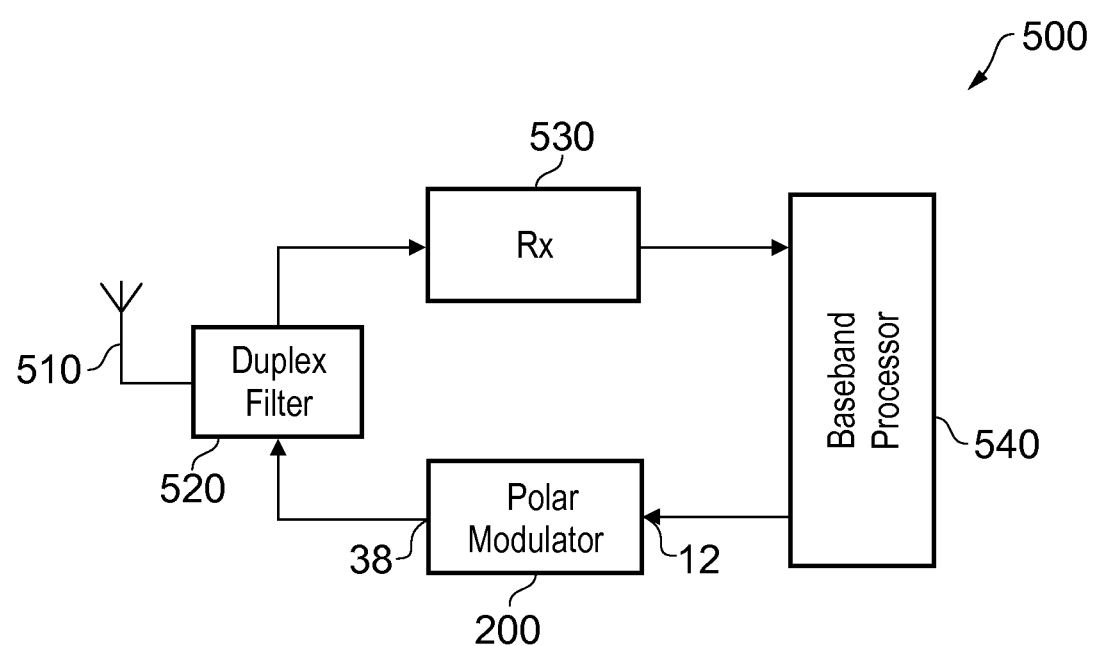
FIG. 21 is a block schematic diagram of a wireless communication apparatus.

Referring to FIG. 21, a wireless communication apparatus 500, such as a mobile phone, comprises an antenna coupled to a duplex filter 520. An output of the duplex filter is coupled to an input of a receiver (Rx) 530, and an output of the receiver 530 is coupled to an input of a baseband processor (BB) 540. An output of the baseband processor 540 is coupled to the first input 18 of the modulation generator 10 of the polar modulator 200, and the output 38 of the amplitude modulation stage 30 of the polar modulator 200 is coupled to an input of the duplex filter 520. The baseband processor 540 processes received data delivered from the receiver 530, and delivers to the polar modulator 200 data to be transmitted.

Other variations and modifications will be apparent to the skilled person. Such variations and modifications may involve equivalent and other features which are already known and which may be used instead of, or in addition to, features described herein. Features that are described in the context of separate embodiments may be provided in combination in a single embodiment. Conversely, features which are described in the context of a single embodiment may also be provided separately or in any suitable sub-combination.

It should be noted that the term "comprising" does not exclude other elements or steps, the term "a" or "an" does not exclude a plurality, a single feature may fulfil the functions of several features recited in the claims and reference signs in the claims shall not be construed as limiting the scope of the claims. It should also be noted that the Figures are not necessarily to scale; emphasis instead generally being placed upon illustrating the principles of the present invention.

The invention claimed is:

1. A polar modulator comprising:
a modulation generator arranged to generate phase modulation data and amplitude modulation data;
a phase modulation stage arranged to generate a phase modulated, PM, carrier signal and a PM clock signal, wherein:
the PM carrier signal has a PM carrier signal frequency and the PM clock signal has a PM clock signal frequency, and the PM carrier signal frequency is higher than the PM clock signal frequency,
the PM carrier signal and the PM clock signal are phase modulated by the phase modulation data, and
the phase modulation stage comprises an adjustable delay stage arranged to adjust a relative delay between the PM carrier signal and the PM clock signal to a target value;
a re-timing circuit arranged to generate an amplitude modulation, AM, clock signal by re-timing the PM clock signal with the PM carrier signal;
an amplitude modulation stage arranged to employ the AM clock signal to clock the amplitude modulation data into the amplitude modulation stage and arranged to amplitude modulate the PM carrier signal with the amplitude modulation data;
an error detection stage arranged to generate an indication of a magnitude of a first deviation of the AM clock signal from a target condition; and
a control stage arranged to select the target value of the relative delay by determining, by controlling the adjustment of the relative delay by the adjustable delay stage, a first value of the relative delay that maximizes the magnitude of the first deviation, and applying an offset to the first value of the relative delay.

2. A polar modulator as claimed in claim 1, wherein:
the error detection stage is arranged to generate an indication of a magnitude of a second deviation of the AM clock signal from the target condition, wherein the first deviation and the second deviation have opposite polarities; and
the control stage is arranged to determine a second value of the relative delay that maximizes the magnitude of the second deviation and arranged to select the offset in the range 40% to 60% of a difference between the first and second values of the relative delay.

3. A polar modulator as claimed in claim 1, wherein the offset is in the range 40% to 60% of the period of the PM carrier signal.

4. A polar modulator as claimed in claim 1, wherein the target condition is a duty cycle of fifty percent.

5. A polar modulator as claimed in claim 1, wherein the error detection stage is arranged to generate the indication of magnitude as an average value of the AM clock signal.

6. A polar modulator as claimed in claim 1, wherein the AM clock signal has a differential format comprising a first differential component and a second differential component, and wherein the target condition is simultaneous switching of polarity of the first and second differential components.

7. A polar modulator as claimed in claim 6, wherein the error detection stage is arranged to generate the indication of magnitude as an average value of a logical AND function of the first and second differential components of the AM clock signal.

8. A polar modulator as claimed in claim 1, wherein the re-timing circuit comprises a latch arranged to re-time the PM clock signal with the PM carrier signal by latching the PM clock signal with an edge of the PM carrier signal.

9. A polar modulator as claimed in claim 1, wherein the adjustable delay stage is arranged to adjust the relative delay between the PM carrier signal and the PM clock signal by means of a digital sequence generator arranged to adjust at least one of a phase and a duty cycle of the PM carrier signal.

10. A polar modulator as claimed in claim 9, wherein the digital sequence generator is arranged to generate a plurality of digital sequences each corresponding to a different combination of phase and duty cycle of the PM carrier signal, and wherein the control stage comprises a look-up table mapping each of the digital sequences to a value of the relative delay.

11. A polar modulator as claimed in claim 9, wherein the adjustable delay stage is arranged to adjust the relative delay between the PM carrier signal and the PM clock signal by varying at least one of a supply voltage and a supply current of the digital sequence generator.

12. A polar modulator as claimed in claim 1, wherein the PM carrier signal frequency is at least eight times the PM clock signal frequency.

13. A polar modulator as claimed in claim 1, wherein the modulation generator generates the phase modulation data and the amplitude modulation data at a rate dependent on the PM clock signal frequency.

14. A wireless communication apparatus comprising a polar modulator as claimed in claim 1.

15. A polar modulator as claimed in claim 1, wherein the re-timing circuit is arranged to receive the PM carrier signal from the adjustable delay stage and the PM clock signal from the modulation generator and output the AM clock signal generated from the PM carrier and PM clock signals.

16. A polar modulator as claimed in claim 1, wherein the error detection stage is arranged to receive the AM clock signal from the re-timing circuit and provide the indication of the magnitude of the first deviation of the AM clock signal from the target condition to the control stage.

17. A polar modulator as claimed in claim 1, wherein the amplitude modulation stage is arranged to receive the AM clock signal from the re-timing circuit, the amplitude modulation data from the modulation generator, and the PM carrier signal from the adjustable delay stage.

18. A method of calibrating a polar modulator, comprising:
generating phase modulation data;
generating a phase modulated, PM, carrier signal and a PM clock signal, wherein
    the PM carrier signal has a higher frequency than the PM clock signal,
    the PM carrier signal and the PM clock signal are phase modulated by the phase modulation data;
generating an amplitude modulation, AM, clock signal by re-timing the PM clock signal with the PM carrier signal;
generating an indication of a magnitude of a first deviation of the AM clock signal from a target condition;
adjusting a relative delay between the PM carrier signal and the PM clock signal to determine a first value of the relative delay which maximizes the magnitude of the first deviation;
selecting a target value of the relative delay by applying an offset to the first value of the relative delay; and
adjusting the relative delay to the target value.

\* \* \* \* \*